US009318449B2

(12) United States Patent
Hasch et al.

(10) Patent No.: US 9,318,449 B2
(45) Date of Patent: Apr. 19, 2016

(54) SEMICONDUCTOR MODULE HAVING AN INTEGRATED WAVEGUIDE FOR RADAR SIGNALS

(71) Applicants: Juergen Hasch, Stuttgart (DE); Uwe Wostradowski, Weil der Stadt-Merklingen (DE); Stefan Gaier, Stuttgart (DE); Elena Pancera, Leonberg (DE); Carsten Potratz, Gerlingen (DE)

(72) Inventors: Juergen Hasch, Stuttgart (DE); Uwe Wostradowski, Weil der Stadt-Merklingen (DE); Stefan Gaier, Stuttgart (DE); Elena Pancera, Leonberg (DE); Carsten Potratz, Gerlingen (DE)

(73) Assignee: ROBERT BOSCH GmbH, Stuttgart (DE)

( * ) Notice: Subject to any disclaimer, the term of this patent is extended or adjusted under 35 U.S.C. 154(b) by 0 days.

(21) Appl. No.: 14/382,211

(22) PCT Filed: Jan. 18, 2013

(86) PCT No.: PCT/EP2013/050928
§ 371 (c)(1),
(2) Date: Aug. 29, 2014

(87) PCT Pub. No.: WO2013/127561
PCT Pub. Date: Sep. 6, 2013

(65) Prior Publication Data
US 2015/0048471 A1   Feb. 19, 2015

(30) Foreign Application Priority Data
Mar. 2, 2012   (DE) .......................... 10 2012 203 293

(51) Int. Cl.
*H01L 21/00*    (2006.01)
*H01L 23/00*    (2006.01)
(Continued)

(52) U.S. Cl.
CPC ............ *H01L 23/66* (2013.01); *H01L 21/4803* (2013.01); *H01L 21/4846* (2013.01); *H01L 23/528* (2013.01); *H01L 27/144* (2013.01); *H01P 3/121* (2013.01); *H01P 5/107* (2013.01);
(Continued)

(58) Field of Classification Search
CPC ..... H01L 23/66; H01L 23/528; H01L 23/293; H01L 27/144; H01L 21/4803; H01L 21/4846; H01L 21/565; H01L 2924/0002; H01L 25/16; H01L 2223/6627; H01L 2223/6677; H01L 2223/6683; H01L 2924/00; H01P 5/107; H01P 3/121
See application file for complete search history.

(56) References Cited

U.S. PATENT DOCUMENTS 6,040,739 A      3/2000 Wedeen et al.
6,621,381 B1 *   9/2003 Kundu et al. ................. 333/202
(Continued)

FOREIGN PATENT DOCUMENTS

DE   10 2010 001 407    9/2010
EP        1 936 741      6/2008
(Continued)

*Primary Examiner* — Nikolay Yushin
(74) *Attorney, Agent, or Firm* — Kenyon & Kenyon LLP

(57) ABSTRACT

A semiconductor module, having an integrated circuit, a rewiring layer for externally connecting the integrated circuit, and at least one waveguide integrated into the semiconductor module for radar signals having a conductive pattern, which laterally surrounds the interior of the waveguides, the integrated circuit and the at least one waveguide being embedded, at least in regions, in a housing material of the semiconductor module; as well as a radar sensor, a motor vehicle radar system having such a semiconductor module, and a method for producing a semiconductor module.

13 Claims, 7 Drawing Sheets

(51) Int. Cl.
*H01L 27/00* (2006.01)
*H01L 23/66* (2006.01)
*H01P 3/12* (2006.01)
*H01P 5/107* (2006.01)
*H01L 21/48* (2006.01)
*H01L 23/528* (2006.01)
*H01L 27/144* (2006.01)
*H01L 25/16* (2006.01)
*H01L 23/29* (2006.01)
*H01L 21/56* (2006.01)

(52) U.S. Cl.
CPC ............ *H01L 21/565* (2013.01); *H01L 23/293* (2013.01); *H01L 25/16* (2013.01); *H01L 2223/6627* (2013.01); *H01L 2223/6677* (2013.01); *H01L 2223/6683* (2013.01); *H01L 2924/0002* (2013.01)

(56) References Cited

U.S. PATENT DOCUMENTS

| | | | |
|---|---|---|---|
| 8,040,286 B2 * | 10/2011 | Matsuo et al. | 343/771 |
| 8,278,749 B2 * | 10/2012 | Lachner et al. | 257/693 |
| 8,564,477 B2 * | 10/2013 | Sagala et al. | 342/175 |
| 2005/0009226 A1 | 1/2005 | Kumagai et al. | |
| 2010/0193935 A1 * | 8/2010 | Lachner et al. | 257/693 |
| 2011/0025552 A1 | 2/2011 | Sagala et al. | |

FOREIGN PATENT DOCUMENTS

| | | |
|---|---|---|
| EP | 1 939 975 | 7/2008 |
| WO | 2011/030277 | 3/2011 |

\* cited by examiner

SEMICONDUCTOR MODULE HAVING AN INTEGRATED WAVEGUIDE FOR RADAR SIGNALS

FIELD OF THE INVENTION

The present invention relates to a semiconductor module having an integrated circuit and having a rewiring layer for externally connecting the integrated circuit. The present invention particularly relates to such a semiconductor module for radar applications, in particular, motor vehicle radar applications. In addition, the present invention relates to a radar sensor having such a semiconductor module as well as a motor vehicle radar system having a semiconductor module of this type.

BACKGROUND INFORMATION

Radar sensors are used for distance and/or speed measurement of objects. In particular, radar systems are known in which speeds and distances of a plurality of objects are recorded simultaneously. Driving speed controllers are known, for example, for motor vehicles having a radar system for locating a preceding vehicle and for measuring the distance from it. Such a distance controller system is also designated as an ACC system (Adaptive Cruise Control).

In order to simplify the construction of HF circuits for radar applications, integrated microwave circuits of the MMIC type (Microwave Monolithic Integrated Circuit) are increasingly being used for sending and receiving circuits.

Wafer modules are known in which the module is produced with a rewiring layer (RDL, redistribution layer) for an IC component on a wafer level. The redistribution layer extends over the IC component and a housing molding compound layer surrounding it.

Such a wafer module is also designated as an embedded wafer level gate array (eWLB, embedded Wafer Level Ball Grid Array) or as a Fan-Out Wafer-Level Package. It may be suitable, for instance, for surface mounting on a printed circuit board as in a Ball-Grid Array (BGA).

German document DE 10 2010 001 407 A1 discusses a semiconductor module in which antennas are integrated at wafer level. The semiconductor module includes a first housing molding compound layer and an IC component having an integrated circuit which is embedded in the first housing molding compound layer. An intermediate layer includes a rewiring layer which is connected to the IC component and is used to connect the IC component externally. An integrated antenna structure in the form of a patch antenna is situated within the intermediate layer, and is connected to the IC component. Such a semiconductor module is able to be pre-manufactured with a precision suitable for the high frequency range of, for instance, 77 GHz.

SUMMARY OF THE INVENTION

In a conventional eWLB semiconductor module for radar applications, for the signal output of radar signals into external circuit parts, high-frequency-suitable substrates have to be used in order to transmit radar signals in the millimeter wave range to other circuit parts such as antennas, for example. High-frequency-suitable printed circuit board substrates have the disadvantage, however, that they are very costly.

It is the object of the present invention to create a novel semiconductor module for radar applications which makes possible a signal input and/or a signal output of radar signals.

This object is attained in the present invention by a semiconductor module of the type named at the outset, having at least one waveguide for radar signals integrated in the semiconductor module, which has a conductive pattern which laterally surrounds the inside of the waveguide, the integrated circuit and the at least one waveguide being embedded in a housing material of the semiconductor module, at least in regions. The conductive pattern is an electrically conductive pattern and may, for instance, be a conductor housing or a conductor cage. It may have at least one open end. The conductor pattern laterally surrounds the inside of the waveguide. Consequently, a circumference of the inside of the at least one waveguide is bordered transversely to the direction of propagation of the radar signals by the conductive pattern. The waveguide is equipped to enable the propagation of an electromagnetic wave in the longitudinal direction of the waveguide on the inside of the waveguide, especially in the manner of a hollow conductor or a hollow conductor filled with a dielectric.

A waveguide integrated in such a way makes it possible to output radar frequency signals directly as an electromagnetic wave from the semiconductor module and/or to input it into the semiconductor module. The at least one waveguide may be coupled, for instance, to a correspondingly configured external waveguide or to an external waveguide in the form of a hollow conductor. Thus, radar signals may be input or output without a high-frequency-suitable printed circuit board substrate being required for it.

The housing material may be a housing molding compound, that is, a formed material or a molding material, which forms the housing for the integrated circuit.

The integrated circuit may be a monolithic integrated microwave circuit (MMIC).

The semiconductor module may have a wafer unit and an interface layer, the wafer unit having a semiconductor chip which forms the integrated circuit and a housing layer which is formed by the housing material named of the semiconductor module and in which the semiconductor chip and the at least one waveguide are situated, and the interface layer having the rewiring layer which connects the integrated circuit to the external terminals of the interface layer. The semiconductor module may be an eWLB semiconductor module, for example.

The integrated circuit may include an oscillator for generating a radar signal, particularly a radar signal having frequencies in the range of microwaves, that is, decimeter, centimeter and/or millimeter waves.

The object is further attained by a method for producing a semiconductor module having an integrated circuit, having the steps:
  providing a semiconductor chip in the form of an integrated circuit, particularly a monolithic integrated microwave circuit; and
  producing a housing layer of a housing of the semiconductor module that borders at least laterally on the semiconductor chip, at least one waveguide being integrated into the housing layer which has a conductive pattern which laterally surrounds the inside of the waveguide;
the method further including the step:
  producing a rewiring layer on at least one side of the housing layer.

In one specific embodiment, the object is attained by a method for producing a semiconductor module having an integrated circuit, having the steps:
  providing a semiconductor chip in the form of an integrated circuit, particularly a monolithic integrated microwave circuit; and positioning at least one conductive pattern next to the semiconductor chip; and producing a housing layer of a housing of the semiconductor module that borders at least laterally on the semiconductor chip and the conductive pattern;

at least one waveguide being formed which includes the at least one conductive pattern, which laterally surrounds the inside of the waveguide, and the method further including the step:

producing a rewiring layer on at least one side of the housing layer.

In one further specific embodiment, the object is attained by a method for producing a semiconductor module having an integrated circuit, having the steps:

providing a semiconductor chip in the form of an integrated circuit, particularly a monolithic integrated microwave circuit; and producing a housing layer of a housing of the semiconductor module which borders on the semiconductor chip at least laterally, whereby vertical conductor elements are produced in the housing layer;

producing vertically distanced, horizontal conductor elements which are connected via the vertical conductor elements and which form with the latter at least one conductive pattern of at least one waveguide for radar signals, whose inside laterally surround the horizontal and vertical conductor elements; and producing a rewiring layer on at least one side of the housing layer. The vertical conductor elements may be through hole contactings in the housing layer, which are also designated as through-mold vias (TVM). The horizontal conductor elements may be metal areas, particularly metal areas on a surface of the housing layer, especially on opposite surfaces of the housing layer. A metal area may be produced in the rewiring layer, for example.

In the following, exemplary embodiments of the present invention are explained in greater detail with the aid of the drawings.

DETAILED DESCRIPTION

Figure 1:
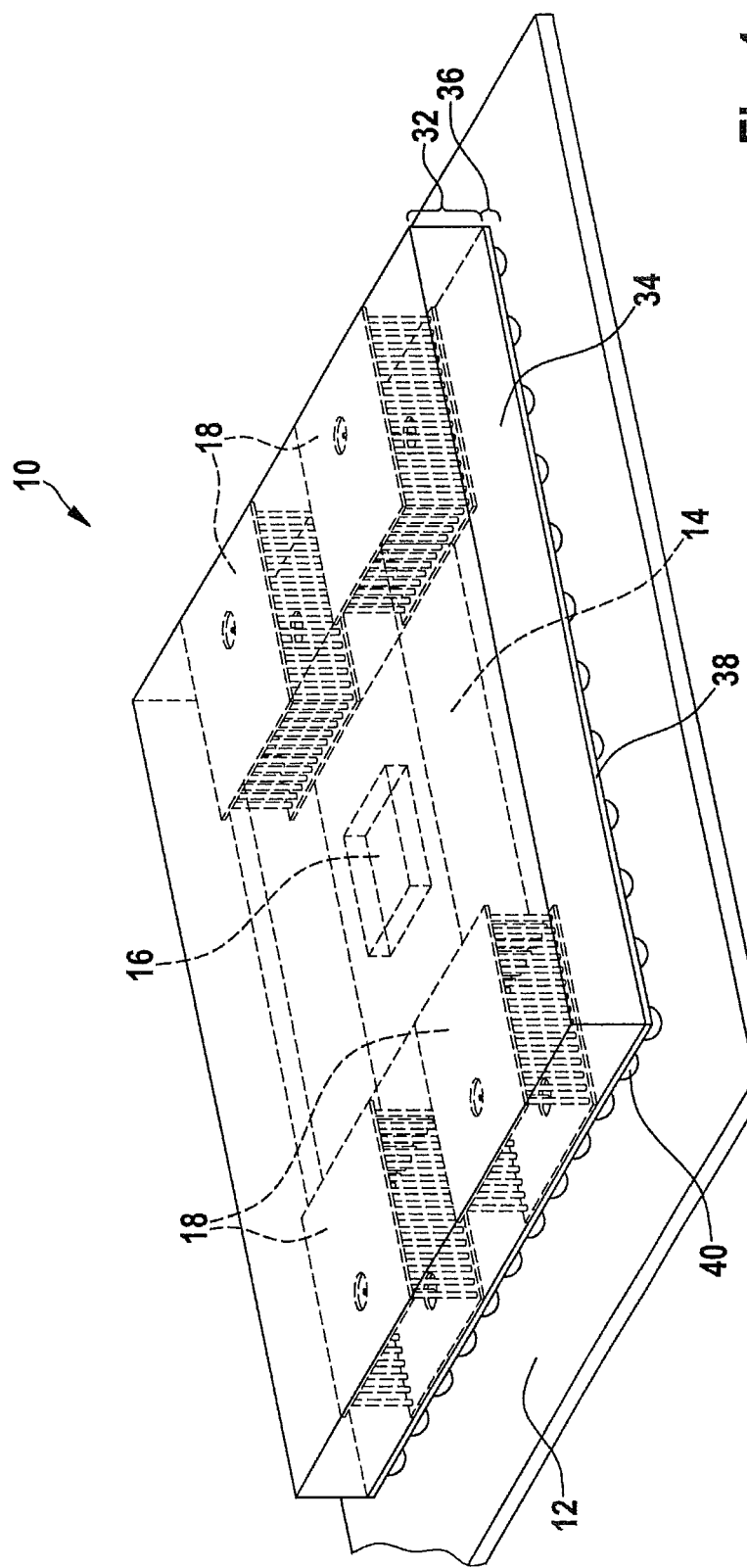
FIG. 1 shows a schematic, perspective view of a semiconductor module having integrated waveguides.

In a perspective view, FIG. 1 schematically shows a semiconductor module 10 which is mounted on a printed-circuit board 12.

Semiconductor module 10 includes an integrated circuit 14 in the form of a semiconductor chip, particularly an MMIC chip (Monolithic Microwave Integrated Circuit). Integrated circuit 14 may, for instance, have the HF part of a send and/or receive circuit for radar signals. In particular, integrated circuit 14 may have an HF oscillator 16 for generating a radar signal. Moreover, integrated circuit 14, in a manner known per se, may have a mixer for mixing a received radar signal with a radar signal generated by HF oscillator 16

Semiconductor module 10 further includes wafer-integrated waveguides 18. Wafer-integrated waveguides 18 each include a conductive pattern having an upper wall 20 and a lower wall 22 in the form of metal layers and having side walls 24, each in the form of a row of through hole contactings 26 (through mold vias), as shown schematically in FIG. 2. Through hole contactings 26 each connect upper and lower walls 20, 22. Waveguide 18 thus corresponds to a rectangular waveguide, whose conductive pattern forms a cage pattern and laterally surrounds or encloses the inside of the waveguide. Waveguide 18 runs in the horizontal direction, with respect to an horizontal alignment of integrated circuit 14 and the rewiring layer. Waveguide 18 has a closed end having a wall 28, which, in turn, is formed by a row of through hole contactings 26, and an open end 30 for outputting or inputting an electromagnetic wave. Open end 30 of conductive pattern of waveguides 18 corresponds to the radiating or receiving end of waveguides 18.

Semiconductor module 10 shown in FIG. 1 is an eWLB package in which a wafer unit 32 includes the semiconductor chip forming integrated circuit 14 and a housing molding compound layer in the form of a housing layer 34, in which semiconductor chip 14 and waveguides 18 are embedded. Such a wafer unit 32 combined during the production of the housing of integrated circuit 14 is also designated as a reconstituted wafer. Wafer unit 32 is equipped with an interface layer 36, which has a rewiring layer 38 and optional terminals 40 in the form of 3D connecting structures, particularly solder balls. Rewiring layer 38 has points of contact on a first side, which contact points of contact of wafer unit 32 and especially of integrated circuit 14. On a second side, rewiring layer 38 is connected to terminals 40 for external contacting. Semiconductor module 10 is able to be applied to printed-circuit board 12 using standard processes, particularly surface mounting processes.

Waveguides 18 are integrated into wafer unit 32 laterally next to integrated circuit 14. In this context, in each case open end 30 of a waveguide 18 faces a lateral surface of wafer unit 32, and is situated at the lateral edge of wafer unit 32, in particular. This, for example, is able to make possible outputting and/or inputting a radar signal in the form of an electromagnetic wave at the lateral surface of wafer unit 32.

Figure 2:
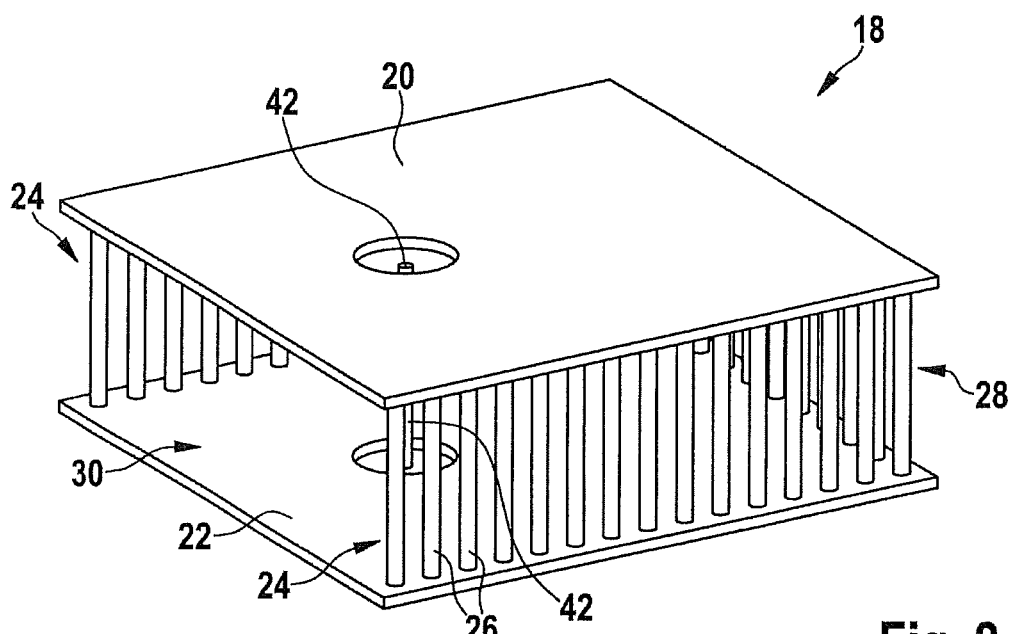
FIG. 2 shows a schematic view of a conductive pattern of a waveguide and a coupling element.

Respective waveguide 18 is provided with a coupling element 42 for signal coupling, particularly for the signal coupling of waveguide 18 to integrated circuit 14. In the example of FIG. 2, coupling element 42 is formed in each case by an exciter rod in the form of an additional through hole contacting (through mold via), which is insulated from walls 20, 22, 24 of waveguide 18 and extends transversely to the longitudinal direction of waveguide 18 into the interior of waveguide 18. However, one may also provide a plurality of exciter rods. Coupling element 42 is connected, for example, to integrated circuit 14 via the rewiring layer.

A production method for a semiconductor module will be described below using the example of semiconductor module 10.

Integrated circuit 14 is provided in the form of a semiconductor chip. Wafer unit 32 with housing layer 34 of the housing of semiconductor module 10 that borders at least laterally on the semiconductor chip
is produced, for example, by filling a housing molding compound into a die cavity in which the semiconductor chip is situated. Rewiring layer 38 is produced on a surface of wafer unit 32, rewiring layer 38 including the respective lower walls 22 of waveguides 18, each in the form of a metallization layer. In housing layer 34, through hole contactings 26 and the through hole contacting of coupling element 42 are made of a conductive material such as a metal, for example. Through hole contactings 26 contact the respective lower wall 22 electrically. Upper walls 20 of the respective waveguides 18 are produced in the form of a metallization layer on a surface of wafer unit 32. Upper walls 20 contact the corresponding through hole contactings 26 electrically.

The method further optionally includes the production of a connecting pattern with the external terminals 40, which are connected via rewiring layer 38 to integrated circuit 14, for example. The production of the connecting pattern may take place, for instance, in the sequence described, or even after the production of rewiring layer 38 and, for example, before the production of the through hole contactings or upper walls 20.

Waveguide 18 is filled with a dielectric material, in particular with the housing material of housing layer 34. The diameter and the distance of through hole contactings 26, as well as the cross section of rectangular waveguide 18, especially the distance between sidewalls 24, whose distance is greater than the distance between the upper and lower walls 20, 22, while taking into account the relative permittivity of the dielectric material, are adjusted to the radar frequencies that are to be transmitted.

Figure 3:
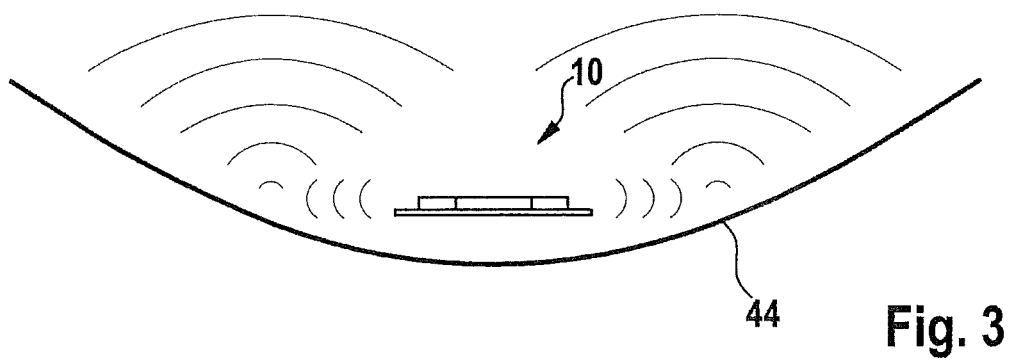
FIG. 3 shows a cross sectional view of an arrangement of the semiconductor module, as in FIG. 1, in a radar reflector.

As an essential part of a motor vehicle radar system, FIG. 3 shows a radar sensor having a semiconductor module 10, of the type described, which is situated in front of a radar reflector 44. Radar reflector 44 may be, for example, a parabolic mirror.

Coupling elements 42 of respective waveguides 18 are connected to the send and receive circuit of integrated circuit 14, in order to input radar signals, based on a signal generated by HF oscillator 16, into respective waveguides 18. Waveguides 18 are used as output elements for outputting the radar signals laterally out of semiconductor module 10. Semiconductor module 10 forms an exciter element for radar reflector 44, which is configured to radiate the radar signals output from semiconductor module 10 in the radiation direction of the radar sensor.

Radar reflector 44 is used at the same time to conduct incident radar signals reflected by a radar object to waveguides 18 used as input elements, so as to input the radar signals into waveguides 18, via open ends 30. The radar signals received are, in turn, picked off via coupling element 42 and supplied to sending/receiving circuit of integrated circuit 14.

Consequently, integrated waveguides 18 may be used to send and receive radar signals. For instance, four waveguides 18 may be integrated in semiconductor module 10, waveguides 18 being able to be connected each to a single send/receive channel of integrated circuit 14.

Because of the integration of waveguides 18 into semiconductor module 10 produced at wafer level, a particularly good HF coupling of waveguides 18 to integrated circuit 14 is possible. In addition, the use of a waveguide having a conductive pattern which laterally surrounds the interior of the respective waveguide, has the advantage that the walls of the waveguide surrounding the inside of the waveguides all around, establish the electrical properties precisely. The electrical field of the radar wave is guided on the inside of waveguides 18, and is thus screened by the walls of waveguides 18 from other circuit parts of semiconductor module 10 and/or external circuit parts. The radiation and/or receiving properties of waveguides 18 used as output elements or input elements are therefore particularly well defined and are able to be optimized.

Figure 4:
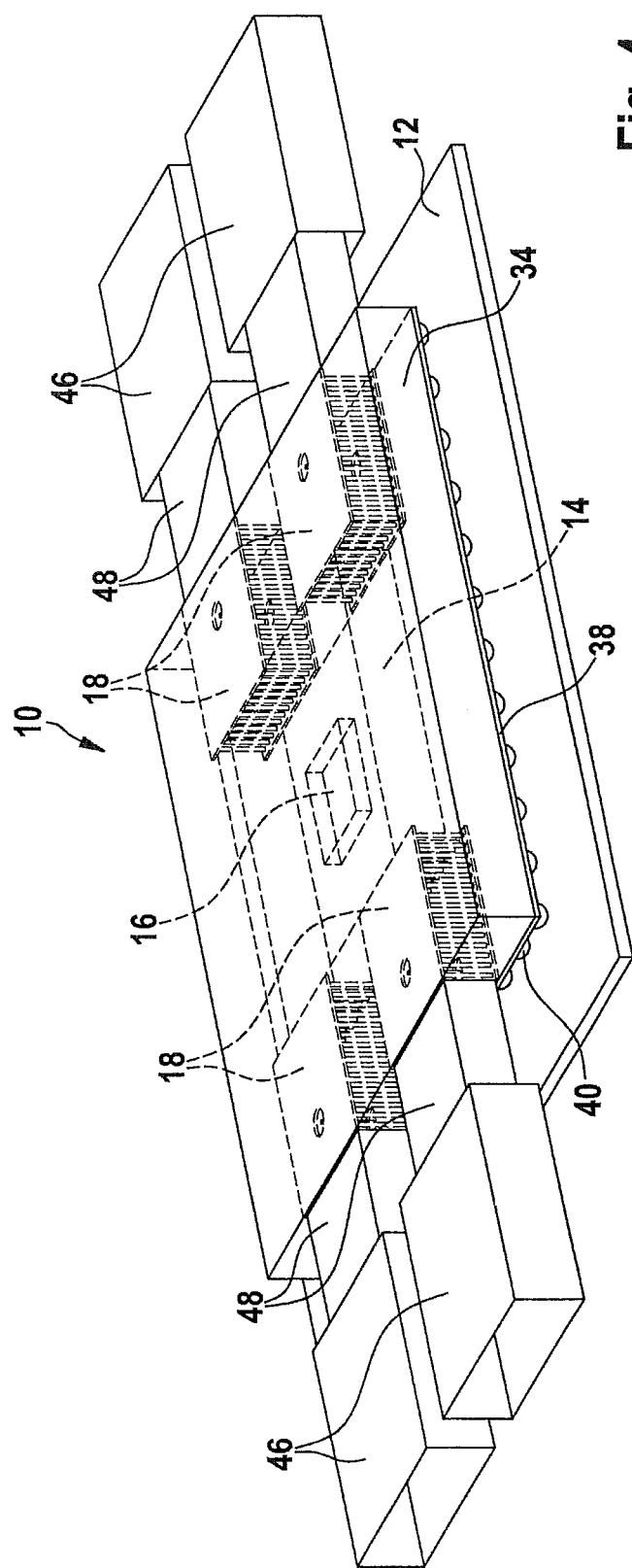
FIG. 4 shows a view of an arrangement of the semiconductor module having integrated waveguides, which are connected to external hollow conductors.

Whereas FIG. 3 shows a radar sensor having direct radiation of the radar signals output by semiconductor module 10, FIG. 4 shows a view of a system for inputting radar signals output by semiconductor module 10 into external waveguides, for instance, in the form of hollow conductors 46. Hollow conductors 46 are each situated with an open end in front of an open end 30 of the conductive pattern of a waveguide 18, in order to enable an input of an electromagnetic wave guided in waveguides 18 into the respective hollow conductor 46.

On semiconductor module 10, in front of open ends 30 of the conductive patterns of waveguides 18, extensions or tongues made of a dielectric material are optionally mounted. The dielectric material is, for example, the housing material of housing layer 34, and thus has the same relative permittivity as the material on the inside of waveguides 18. The tongues have, for instance, a cross section which is essentially equivalent to the inside cross section of respective waveguide 18. In the production of wafer unit 32, for example, they are connected in an attached form to housing layer 34, and may particularly be produced together with housing layer 34.

In the example shown, tongues 48 each extend into corresponding hollow conductors 46, in sections. Thus, the electromagnetic coupling between waveguides 18 and hollow conductors 46 is able to be improved without a mechanical contacting between hollow conductors 46 and semiconductor module 10.

Figure 5:
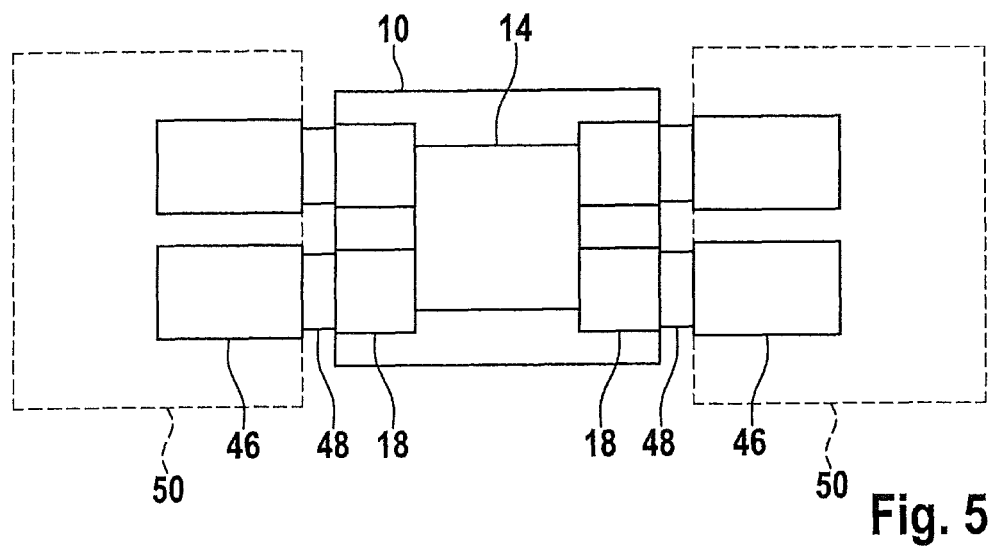
FIG. 5 shows a block representation of the semiconductor module having integrated waveguides, which are connected to external distribution structure.

The external waveguides are part of a distribution structure 50 for the radar signals, which is shown schematically in FIG. 5, for example. Distribution structure 50 may include additional hollow conductors and/or waveguides, particularly waveguides filled with a dielectric material.

Figure 6:
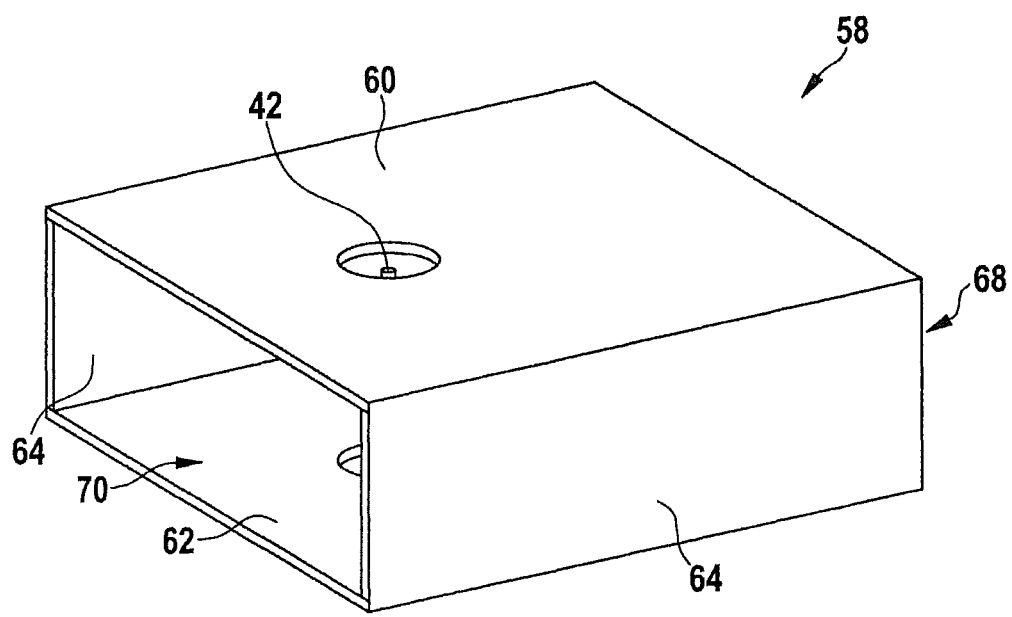
FIG. 6 shows an additional exemplary embodiment of a conductive pattern of a waveguide.

FIG. 6 shows a conductive pattern of a further example of a waveguide 58, which, for instance, instead of a waveguide 18, may be integrated in semiconductor module 10 as in FIG. 1. Waveguide 58 is a rectangular waveguide and is filled with a dielectric material. The conductive pattern of waveguides 58 forms a conductor housing and includes an upper wall 60, a lower wall 62 and sidewalls 64 which connect upper and lower walls 60, 62 to each other. Walls 60, 62, 64 surround the inside of waveguide 58 all around laterally. Waveguide 58, in turn, has a closed end having a wall 68, as well as an open end 70. Consequently, waveguide 58 is a waveguide 58 filled with a dielectric material and wafer-integrated.

Waveguide 58 is provided with a coupling element 42 which, in the same manner as with waveguides 18, is formed by at least one through hole contacting, insulated from walls 60, 62, which is connected to integrated circuit 14 via the rewiring layer 38.

A production method for a semiconductor module having waveguides 58 will be described below, using as an example the production of semiconductor module 10 provided with waveguides 58 instead of waveguides 18.

Integrated circuit 14 is provided in the form of a semiconductor chip with integrated HF oscillator 16. The conductive patterns of waveguides 58 are provided and situated next to integrated circuit 14. The conductive pattern for a waveguide 58 may, for example, be provided in the form of an insertion part made up of walls 60, 62, 64, 68 and positioned in a mold cavity together with integrated circuit 14.

Wafer unit 32 is produced by producing housing layer 34 bordering laterally on semiconductor chip 14. Coupling elements 42 are produced in the form of through hole contactings. Rewiring layer 38 is produced in that coupling elements 42 are connected to integrated circuit 14. Corresponding to the method explained above, the method also includes producing interface layer 36 inclusive of terminals 40 of the connecting pattern.

Similarly to semiconductor module 10 with waveguides 18, the semiconductor module may also be used with waveguides 58, according to the examples in FIGS. 3 to 5.

Figure 7:
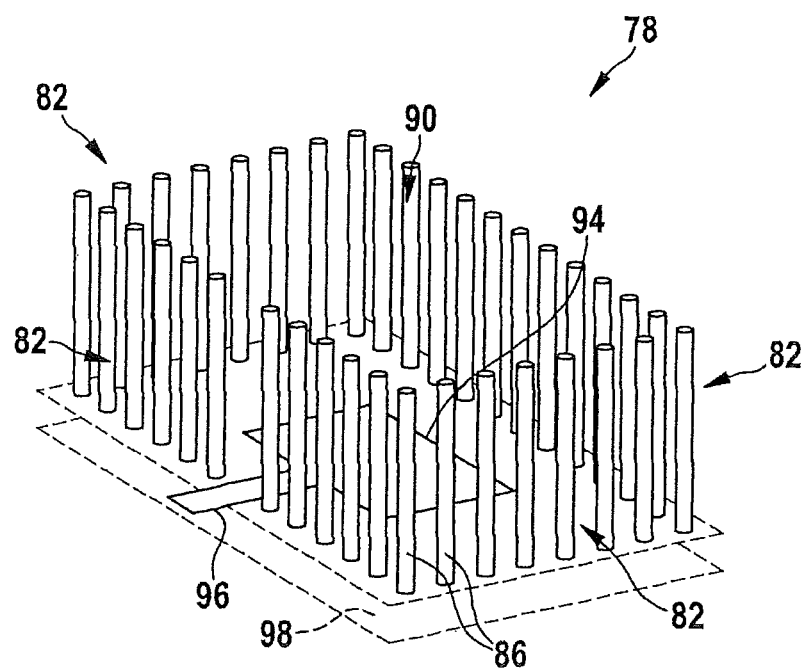
FIG. 7 shows a schematic view of a further exemplary embodiment of a conductive pattern of a waveguide.
Figure 8:
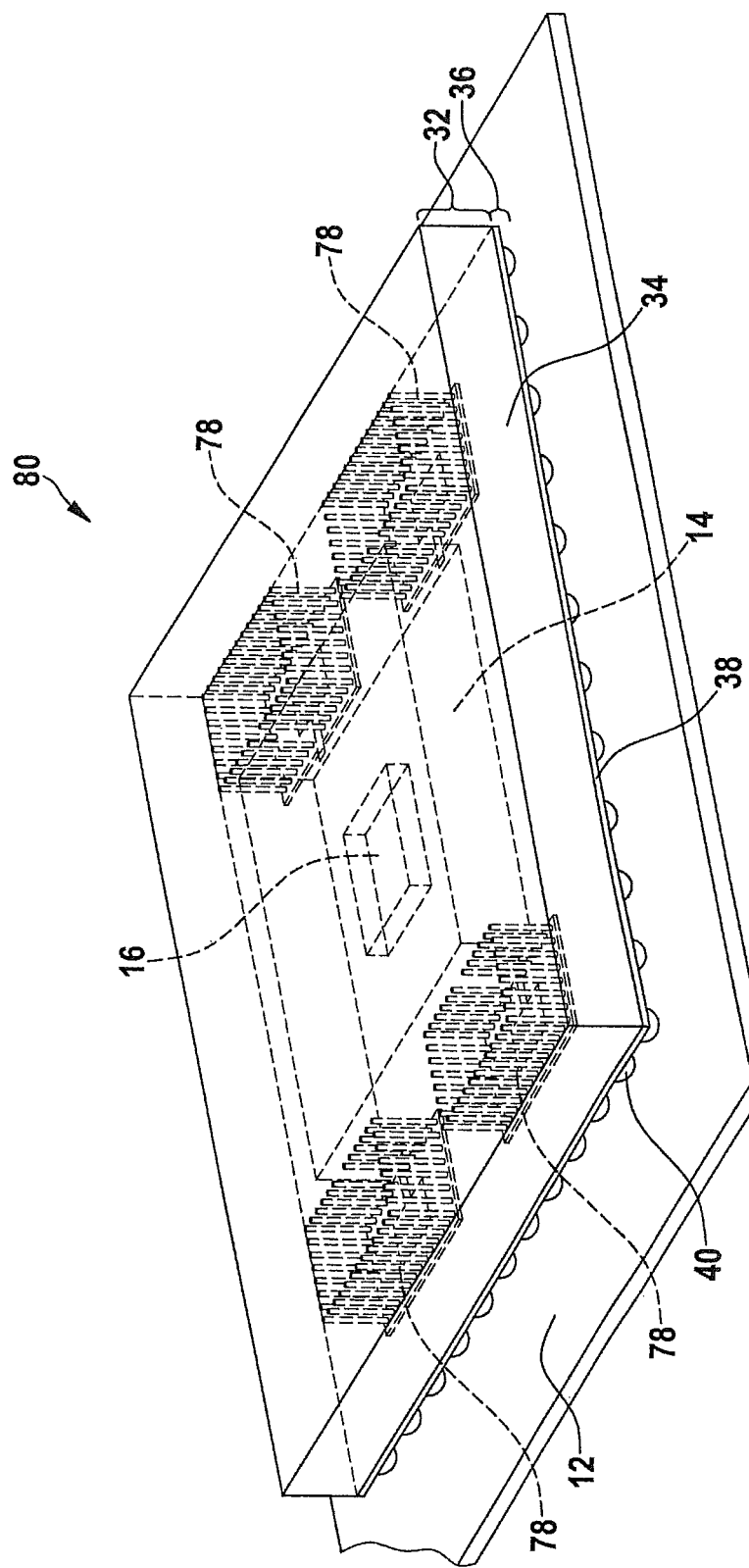
FIG. 8 shows a schematic view of a semiconductor module having waveguides that have the conductive pattern corresponding to FIG. 7.

FIG. 7 shows a conductive pattern of a further exemplary embodiment of a waveguide 78, in which the waveguide runs in the vertical direction and is integrated, for example, in a semiconductor module 80 shown in FIG. 8. Semiconductor module 80 shown in FIG. 8, by the way, corresponds to the abovementioned semiconductor module 10, and similar or mutually corresponding elements are characterized by the same reference numerals.

Waveguide 78 is a rectangular waveguide, in which sidewalls 82 of the conductive pattern are each formed by a row of through hole contactings 86 (through mold vias). The conductive pattern of waveguide 78 thus forms a cage structure and surrounds and encloses laterally the interior of the waveguide. An upper open end 30 of the conductive pattern of waveguide 78 is directed towards an upper side surface of wafer unit 32 of semiconductor module 80 and situated on the upper surface of housing layer 34 of semiconductor module 80, in order, for example, to enable an output and/or input of a radar signal on the upper side of semiconductor module 80.

Waveguide 78 is provided with a coupling element 94 in the form of a planar conductive pattern, such as a patch antenna, which is situated at a rear end of the interior of waveguide 78. The patch antenna may be developed, for instance, inside rewiring layer 38 and may be connected via rewiring layer 38 to integrated circuit 14. FIG. 7 schematically shows an electrical connection 96 of the patch antenna to integrated circuit 14, in the form of a conductor strip.

Farther in front of the rear end of waveguides 78, on the other side of coupling element 94, a ground area 98 is optionally provided which may be developed in a second wiring plane of rewiring layer 38, for example. Ground area 98 may prevent an undesired downwards radiation of radar signals.

The production of semiconductor module 80 may take place in a manner corresponding to the abovementioned production of semiconductor module 10, coupling element 94 being produced instead of lower wall 22 and through hole contactings 86 of sidewalls 82 being connected to one another in rewiring layer 38, for example. Instead of sidewalls 24, sidewalls 82 are produced in the form of through hole contactings 86. Upper wall 20 is omitted, since open end 90 of waveguides 78 is located on the upper side.

In deviation from the example shown in FIGS. 7 and 8, sidewalls 82 of waveguides 78 may also be formed by electrically conductive, planar wall sections similar to walls 60, 62, 64 of waveguide 58. Electrical connection 96 of coupling element 94 is then, in turn, connected to integrated circuit 14, insulated from the sidewalls, and an open end of the waveguide is situated on the upper side of semiconductor module 10, corresponding to the construction shown in FIG. 8. In the production of such a semiconductor module, the sidewalls are produced in the form of an insertion part, for instance, which is situated next to integrated circuit 14 and which will be embedded in the housing material of housing layer 34 of wafer unit 32. As for the rest, the production may correspond to the production described of semiconductor module 80, for example.

Figure 9:
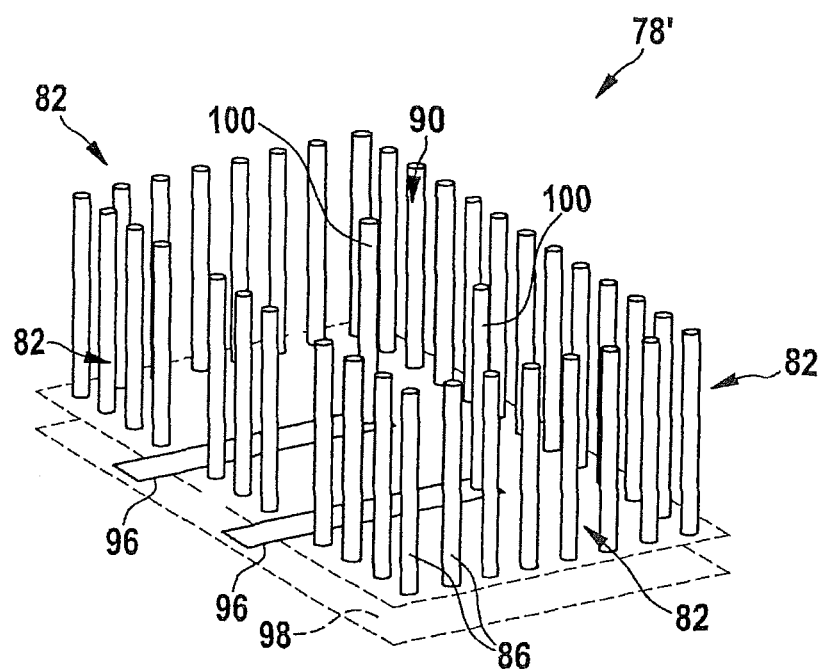
FIG. 9 shows an additional exemplary embodiment of a conductive pattern of a waveguide.

FIG. 9 shows a variant of the exemplary embodiments described with the aid of FIGS. 7 and 8, in which waveguide 78', instead of a coupling element in the form of a patch antenna, has a coupling element 100 in the form of an exciter rod. In the example shown, coupling element 100 includes in particular two exciter rods in the form of through hole contactings which are connected to integrated circuit 14 via electrical connections 96. The exciter rods extend, in the longitudinal direction of waveguides 78, into the interior of the waveguide. As for the rest, the construction of waveguide 78' corresponds to waveguide 78 according to FIG. 7, and waveguides 78' may be integrated in semiconductor module 80, for instance, instead of waveguides 78 shown in FIG. 8.

Again, instead of sidewalls 82 formed by through hole contactings 86, sidewalls in the form of closed, planar wall sections may be provided which are, for example, situated as insertion parts in the production of the semiconductor module, next to integrated circuit 14.

Semiconductor module 80, having waveguides running in the vertical direction, for instance, according to the exemplary embodiments described with the aid of FIGS. 7 to 9, may be configured for the direct radiation of radar signals on the upper side of semiconductor module 80. Semiconductor module 80 may be configured, for instance, as a part of a radar sensor for sending and/or receiving radar signals, in a manner similar to the operating manner described with the aid of FIG. 3.

Instead of a direct radiation, the coupling of waveguides 78 to external waveguides or hollow conductors of a distribution structure may also take place, for instance, corresponding to the examples described in connection with FIGS. 4 and 5. In front of open ends 90 of the conductive patterns of waveguides 78, semiconductor module 80 may have projections or tongues made of a dielectric material, formed corresponding to the cross section of the interior of the waveguides, particularly made of the housing material of wafer unit 32. Consequently, a coupling, directed upwards, of waveguides 78 may take place.

The exemplary embodiments described have the advantage, among other things, of cost savings due to the omission of a costly, high-frequency-suitable printed-circuit board substrate. In addition, it is made possible to supply a plurality of high-frequency signals or radar signals to the semiconductor module and/or away from the semiconductor module, whereby the line guidance is simplified. Lines in the form of waveguides or hollow conductors may run spatially offset to one another, for example, and are not limited to a printed-circuit board level. In addition, it is advantageous that contact losses during the input or output of radar signals are able to be reduced, as well as an undesired coupling and/or the parasitic radiation of individual signals.

What is claimed is:

1. A semiconductor module, comprising:
    a housing layer;
    an integrated circuit;
    a rewiring layer for the external connection of the integrated circuit; and
    at least one waveguide for radar signals and having a conductive pattern which laterally surrounds an interior of the waveguide;
    wherein the integrated circuit and the at least one waveguide are embedded, at least in regions, in a housing material of the housing layer, wherein an open end of the conductive pattern of the at least one waveguide is situated on a surface of the semiconductor module, and wherein the open end is hollow and sized to accommodate an external waveguide.

2. The semiconductor module of claim 1, wherein the integrated circuit includes a monolithic integrated microwave circuit.

3. The semiconductor module of claim 1, further comprising:
a wafer unit; and
an interface layer;
wherein the wafer unit includes a semiconductor chip which forms the integrated circuit, and wherein the interface layer includes the rewiring layer, which connects the integrated circuit to external terminals of the interface layer.

4. The semiconductor module of claim 1, wherein an interior of the at least one waveguide is filled with the housing material of the semiconductor module.

5. The semiconductor module of claim 1, wherein the conductive pattern of the at least one waveguide has one or more electrically conductive walls, the one or more walls circumferentially surrounding the interior of the waveguide.

6. The semiconductor module of claim 1, wherein the conductive pattern of the at least one waveguide includes at least one planar, closed wall section.

7. The semiconductor module of claim 1, wherein the conductive pattern of the at least one waveguide includes at least one vertical wall section which is formed by a row of vertical conductor elements running in parallel to one another.

8. The semiconductor module of claim 1, wherein the semiconductor module has at least one coupling element, which couples a waveguide to the integrated circuit for transmitting radar signals.

9. The semiconductor module of claim 1, wherein the conductive pattern of the at least one waveguide is a conductor housing or a conductor cage.

10. A radar sensor, comprising:
a semiconductor module including a wafer unit and an interface layer;
wherein the wafer unit includes a semiconductor chip which forms the integrated circuit, and a housing layer, which is formed by a housing material of the semiconductor module and in which the semiconductor chip and the at least one waveguide are embedded, and wherein the interface layer includes a rewiring layer, which connects the integrated circuit to external terminals of the interface layer, wherein an open end of the conductive pattern of the at least one waveguide is situated on a surface of the semiconductor module, and wherein the open end is hollow and sized to accommodate an external waveguide.

11. A motor vehicle radar system, comprising:
a semiconductor module including a wafer unit and an interface layer;
wherein the wafer unit includes a semiconductor chip which forms the integrated circuit, and a housing layer, which is formed by a housing material of the semiconductor module and in which the semiconductor chip and at least one waveguide are embedded, and wherein the interface layer includes a rewiring layer, which connects the integrated circuit to external terminals of the interface layer, wherein an open end of the at least one waveguide is situated on a surface of the semiconductor module, and wherein the open end is hollow and sized to accommodate an external waveguide.

12. A method for producing a semiconductor module having at least one integrated waveguide for radar signals, the method comprising:
providing a semiconductor chip in the form of an integrated circuit; and
producing a housing layer of a housing of the semiconductor module that borders at least laterally on the semiconductor chip, at least one waveguide and the integrated circuit being embedded in a housing material of the housing layer which has a conductive pattern which laterally surrounds an interior of the waveguide, wherein an open end of the conductive pattern of the at least one waveguide is situated on a surface of the semiconductor module, and wherein the open end is hollow and sized to accommodate an external waveguide; and
producing a rewiring layer on at least one side of the housing layer.

13. The method of claim 12, wherein the integrated circuit includes a monolithic integrated microwave circuit.

* * * * *